(12) United States Patent
Sohn

(10) Patent No.: US 6,730,568 B2
(45) Date of Patent: May 4, 2004

(54) METHOD FOR FABRICATING SEMICONDUCTOR DEVICE WITH ULTRA-SHALLOW SUPER-STEEP-RETROGRADE EPI-CHANNEL BY BORON-FLUORIDE COMPOUND DOPING

(75) Inventor: Yong-Sun Sohn, Ichon (JP)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/330,437

(22) Filed: Dec. 30, 2002

(65) Prior Publication Data
US 2004/0053457 A1 Mar. 18, 2004

(30) Foreign Application Priority Data
Sep. 17, 2002 (KR) ........................... 2002-56435

(51) Int. Cl.[7] ............................. H01L 21/336
(52) U.S. Cl. ................. 438/289; 438/217; 438/276; 438/530
(58) Field of Search ............... 438/217, 276, 438/289, 297, 510, 514, 530

(56) References Cited

U.S. PATENT DOCUMENTS

| 5,811,843 A | * | 9/1998 | Yamamoto et al. ......... 257/194 |
| 6,087,210 A | * | 7/2000 | Sohn ........................... 438/217 |
| 6,426,279 B1 | | 7/2002 | Huster et al. |
| 6,444,550 B1 | | 9/2002 | Hao et al. |
| 6,475,888 B1 | * | 11/2002 | Sohn ........................... 438/535 |

FOREIGN PATENT DOCUMENTS

KR 2002-49938 6/2002

* cited by examiner

Primary Examiner—Kevin M. Picardat
(74) Attorney, Agent, or Firm—Jacobson Holman PLLC

(57) ABSTRACT

This invention relates to a method for fabricating a semiconductor device with the epi-channel structure, which is adapted to overcome an available energy limitation and to improve the productivity by providing the method of SSR epi Channel doping by boron-fluoride compound ion implantation without using ultra low energy ion implantation and a method for fabricating the semiconductive device with epi-channel structure adapted to prevent the crystal defects caused by the epitaxial growth on ion bombarded and fluorinated channel doping layer. The method for forming the epi-channel of a semiconductor device includes the steps of: forming a channel doping layer below a surface of a semiconductive substrate by implanting boron-fluoride compound ions containing boron; performing an annealing process to remove fluorine ions, injected during above ion implantation, within the channel doping layer; performing the surface treatment process to remove the native oxide layer formed on the surface of the channel doping layer and simultaneously to remove remaining fluorine ions within the channel doping layer; and growing epitaxial layer on the channel doping layer using the selective epitaxial growth method.

17 Claims, 15 Drawing Sheets

METHOD FOR FABRICATING SEMICONDUCTOR DEVICE WITH ULTRA-SHALLOW SUPER-STEEP-RETROGRADE EPI-CHANNEL BY BORON-FLUORIDE COMPOUND DOPING

FIELD OF THE INVENTION

The present invention relates to a method for fabricating a semiconductor device and, more particularly, to a method for fabricating a semiconductor device with an ultra-shallow epi-channel of which the channel length is 100 nm or less.

DESCRIPTION OF THE PRIOR ART

Generally, in transistors such as MOSFETs or MISFETs, the surface area of a semiconductive substrate, which is disposed below a gate electrode and a gate dielectic layer, functions to allow the currents to flow due to the electric field applied to source/drain in a state that a voltage beyond the triggering is applied to the gate electrode. Therefore, this area is called "channel".

In addition, characteristics of these transistors are determined by the dopant concentration of the channel. Accurate doping of the channel is very important since the general properties such as threshold voltage ($V_T$) and drain currents ($I_d$) of a transistor are determined by the dopant concentration.

As a doping method of the channel, channel ion implantation (or threshold voltage adjusting ion implantation) using ion implantation method are widely used. The channel structures that can be formed using the above ion implantation method include a flat channel having a constant concentration within a channel in depth, the buried channel formed the channel at a specific depth away from the surface, the retrograde channel having a low surface concentration and whose concentration within the channel increases rapidly in a depth direction, etc.

Among the above channels, the retrograde channel is widely used in a high performance microprocessor of which the channel length is 0.2 m or less. The retrograde channel is formed using heavy ion implantation of In, As, Sb, etc. Since the retrograde channel has high surface mobility due to the low surface dopant concentration, it has been applied to high performance devices with high driving current characteristics.

However, with decreasing the channel length, the required channel depth must be shallower. Also, the ion implantation techniques have limitations when implementing on the formation of retrograde channel of which the channel depth becomes 50 nm or less.

In order to meet these demands, there has been proposed the epi-channel structure in which an epitaxial layer is formed on a channel doping layer.

FIG. 1A is a cross-sectional diagram of a semiconductor device with a conventional epi-channel structure.

Referring to FIG. 1A, a gate dielectric layer 12 and a gate electrode 13 are formed on a semiconductive substrate 11, and the epi-channel consisting of an epitaxial layer 14 and a channel doping layer 15 is formed on the semiconductive substrate 11 disposed below the gate dielectric layer 12. A high-concentration source/drain extension (SDE) region 16 and a source/drain region 17 are formed on both sides of the epi-channel.

However, since it is difficult to control dopant loss and diffusion of the channel doping layer 15 due to the process of forming the epitaxial layer and the following thermal process, there is a problem to implement the improved on/off current characteristic required for the high performance device with the epi-channel structure.

In order to solve this problem, there has been proposed a method for implementing a delta doped epi-channel by forming a dual epitaxial layer consisting of a doped epitaxial layer doped in a step shape and an undoped epitaxial layer, as shown in FIG. 1B.

FIG. 1B shows the change of a doping profile according to the transient enhanced diffusion (TED) or the thermal budget, followed by the forming of the delta doped epi-channel. Referring to FIG. 1B, since the step-like delta doping profile of the epi-channel below the gate dielectric layer (Gox) does not maintain an ideal delta doping profile (P1) due to the TED or the thermal budget, there occurs the broadening (P2) of the doping profile.

Accordingly, in case where the delta doped epi-channel is formed using the dual epitaxial layer consisting of the doped epitaxial layer and the undoped epitaxial layer, since a low concentration epitaxial layer of $1\times10^{19}$ atoms/cm$^3$ or less cannot be deposited, the diffusion (D) of dopants due to the TED or the thermal budget is too excessive, so that there is a limitation when implementing the delta doped epi-channel of which the channel depth is 30 nm or less.

In order to improve these problems, there is proposed a method in which after forming a delta doped n-channel doping layer having a precisely controlled concentration by ultra low energy boron ion implantation, laser thermal annealing (LTA) process is instantaneously performed to prevent the diffusion of the delta doped n-channel doping layer (referring to FIGS. 2A and 2B).

FIGS. 2A and 2B are cross-sectional diagrams showing the method for fabricating a semiconductor device with an epi-channel formed by ultra low energy ion implantation and by laser thermal annealing (LTA) process.

As shown in FIG. 2A, a field oxide layer 22 with shallow trench isolation (STI) structure is formed on a semiconductive substrate 21, and P-type dopants are ion-implanted into the semiconductive substrate 21 to thereby form P-type well 23. Sequentially, boron ions are implanted under ultra low energy (1 keV) to form a delta doped channel doping layer 24.

Then, the laser thermal annealing (LTA) process of 0.36 J/cm$^2$ to 0.44 J/cm$^2$ is directly performed without any pre-amorphization for amorphizing a surface of the semiconductor substrate 21. As can be seen in FIG. 2B, the laser thermal annealing process suppress the re-distribution of boron within the channel doping layer 24, as well as changing the channel doping layer 24 into chemically stable channel doping layer 24A.

As shown in FIG. 2B, an epitaxial layer 25 is selectively grown on the channel doping layer 24A at a temperature of 600 to 800 to thereby form the super steep retrograde (SSR) epi-channel structure.

Meanwhile, the TED of the delta doped channel doping layer can be prevented by using rapid thermal annealing (RTA) process as well as the laser thermal annealing process.

FIG. 3A and FIG. 3B are the graphs showing the doping profiles of SSR epi-channel formed by selectively epitaxial growth on boron doped specimens of 1 KeV ion implanted or 5 KeV ion implanted, respectively.

As can be seen from FIGS. 3A and 3B, in the doping profiles of SSR epi-channel formed using the ultra low energy ion implantation, as the ion implantation energy becomes lower, a distribution range of delta doping becomes narrower. Since this delta doping which is narrowly distributed as shown in FIG. 3A can remarkably reduce the junction capacitance of device and the junction leakage current, it is an essential technique in manufacturing the low-power and high-efficiency semiconductor device.

However, the ultra low energy ion implantation has disadvantages that the available energy is limited, since it is difficult to extract enough ion beam currents at such ultra low energy range, as well as the manufacturing time is taken longer.

SUMMARY OF THE INVENTION

It is, therefore, an object of the present invention to provide a method for fabricating a semiconductor device with epi-channel structure, which is adapted to overcome an available energy limitation and to improve the productivity by providing the method of SSR epi Channel doping by boron-fluoride compound ion implantation without using ultra low energy ion implantation.

In addition, it is another object of the present invention to provide a method for fabricating the semiconductive device with epi-channel structure adapted to prevent the crystal defects caused by the epitaxial growth on ion bombarded and fluorinated channel doping layer.

In an aspect of the present invention, there is provided a method for forming the epi-channel of a semiconductor device, which comprises the steps of: a) forming a channel doping layer below the surface of a semiconductive substrate by implanting boron-fluoride compound ions containing boron; b) performing the annealing process to remove fluorine ions injected within the channel doping layer; c) performing a surface treatment process to remove the native oxide layer formed on a surface of the channel doping layer and simultaneously remove remaining fluorine ions within the channel doping layer; and d) growing an epitaxial layer on the channel doping layer using the selective epitaxial growth method.

In another aspect of the present invention, there is provided a method for fabricating a semiconductor device, which comprises the steps of: a) forming a channel doping layer below the surface of a semiconductive substrate by to implanting boron-fluoride compound ions containing boron; b) performing the first annealing process to remove fluorine ions, injected during above channel doping implantation, within the channel doping layer; c) performing the surface treatment process to remove the native oxide layer formed on the surface of the channel doping layer and simultaneously remove remaining fluorine ions within the channel doping layer; d) growing the epitaxial layer on the channel doping layer; e) sequentially forming a gate dielectric layer and a gate electrode on the epitaxial layer; f) forming source/drain extension regions arranged at edges of the gate electrode, wherein the source/drain extension region is shallower than the channel doping layer; g) forming spacers contacted with both sides of the gate electrode; h) forming source/drain regions arranged at edges of the spacers of the gate electrode, wherein the source/drain regions are deeper than the channel doping layer; and i) performing the second annealing process, for the activation of dopants contained in the source/drain extension regions and the source/drain regions, at a temperature suppressing the diffusion of the channel doping layer.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, preferred embodiments of the present invention will be descried in detail with reference to attached drawings.

The present invention proposes a method for increasing an ion implantation energy used to form a channel doping layer in forming an epi-channel structure, in which a molecular ion beam containing dopant ions is utilized.

Embodiments that will be described below use $_{49}BF_2^+$ or $_{30}BF^+$, which are extracted from $BF_3$ gas, as molecular ion beams for forming the channel doping layer.

Compared with a boron ($B^+$) ion implantation, $_{49}BF_2^+$ ion implantation has the same ion implantation depth at 4.5 times ion implantation energy. In addition, since it is possible to implantation ions at 4.5 times higher energy, the manufacturing process can be performed using an ordinary low energy ion implantation apparatus without any ultra low energy ion implantation apparatus. Further, under the same ion implantation energy, since the ion implantation depth is shallower compared with the case of the boron ions, the delta doping of which a width is narrower has more adaptable characteristic.

Furthermore, other kind of ions extracted from the $BF_3$ gas is $_{30}B^+$. The $_{30}B^+$ ions are ions extracted by selecting a mass of 30 through a mass analyzing of ion beams using $BF_3$ gas. $_{30}B^+$ ion has half the bonding number of fluorine as many as $_{49}BF_2^+$ ion. Also, since $_{30}BF^+$ ion has half the implantation amount of fluorine as much as $_{49}BF_2^+$ ion, it is possible to prevent occurrence of precipitates of fluorine compounds and fluorine bubbles, found after the following thermal annealing process, due to excessive implantation of fluorine.

Additionally, while the $_{30}B^+$ ion implantation has the same ion implantation depth as the boron ion implantation, there is an advantage that $_{30}B^+$ ion implantation can use 2.7 times higher ion implantation energy than boron ion implantation.

Even though the ion implantation of molecular ions extracted from the fluorine compound has the advantage that it uses higher energy than that of boron ions, boron ions are inevitably implanted together with fluorine ions since the $_{30}BF^+$ ion implantation contains fluorine ions, so that the unintended containing of fluorine causes a crystal defect in a following growth of epitaxial layer and possibly degrades a device characteristic due to a filing-up of fluorine ions at gate dielectric or at the interface between the gate dielectric layer and the semiconductor substrate.

Accordingly, the following embodiments utilizes the fluorine compound ions which can form the shallow junction using higher ion implantation energy when forming the channel doping layer, and explains a method for emitting the fluorine ions, which are injected during the implantation of fluorine compound ions, to an exterior through the following annealing process and the surface treatment process.

Figure 1A:
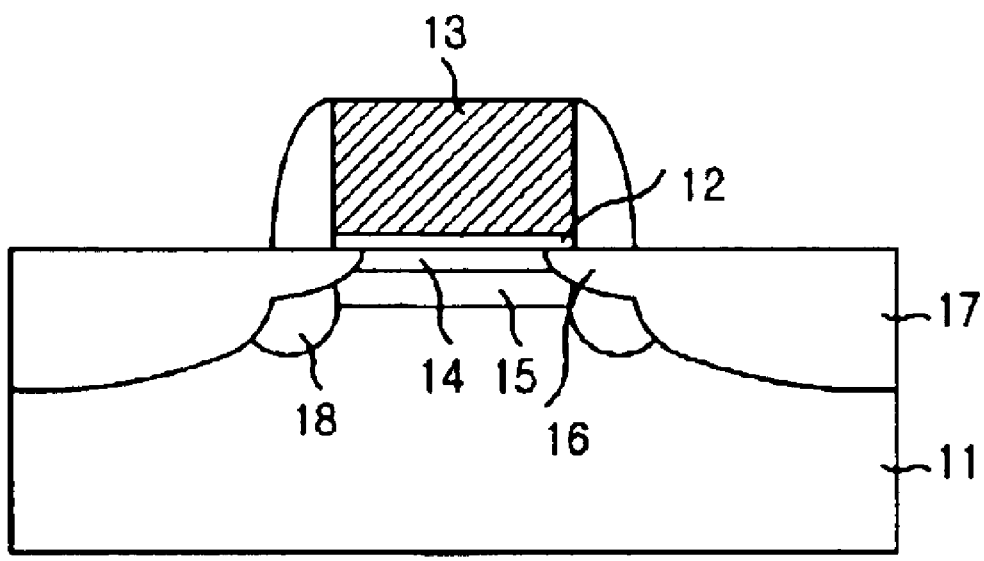
FIG. 1A is a cross-sectional diagram of a semiconductor device with a conventional epi-channel.
Figure 1B:
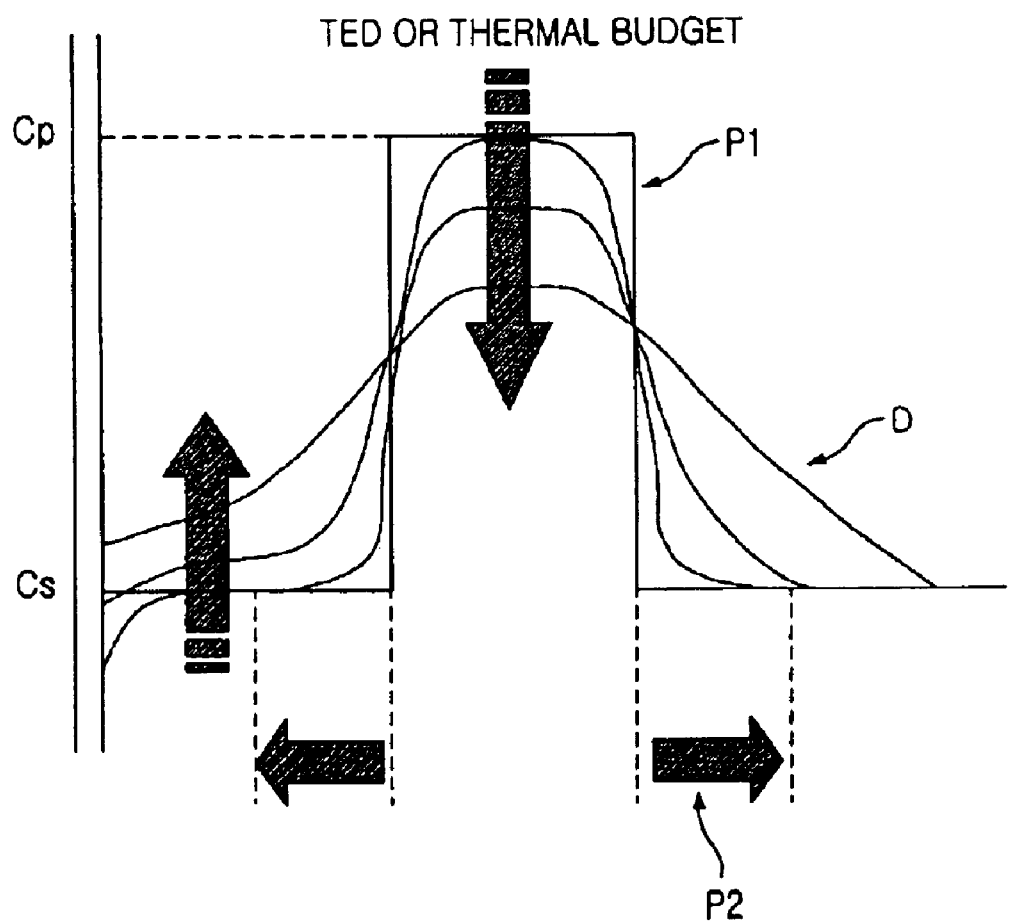
FIG. 1B shows the change of a doping profile in the epi-channel according to TED or thermal budget.
Figure 2A:
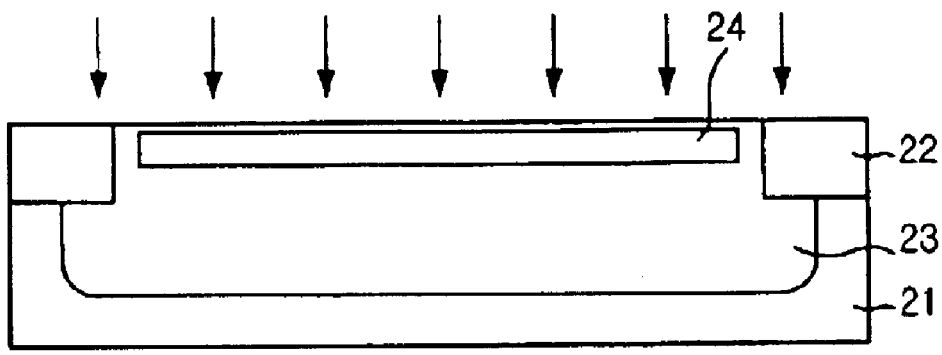
FIGS. 2A and 2B are cross-sectional diagrams showing a method for fabricating a semiconductor device with epi-channel formed using ultra low energy ion implantation and laser thermal annealing (LTA) process.
Figure 2B:
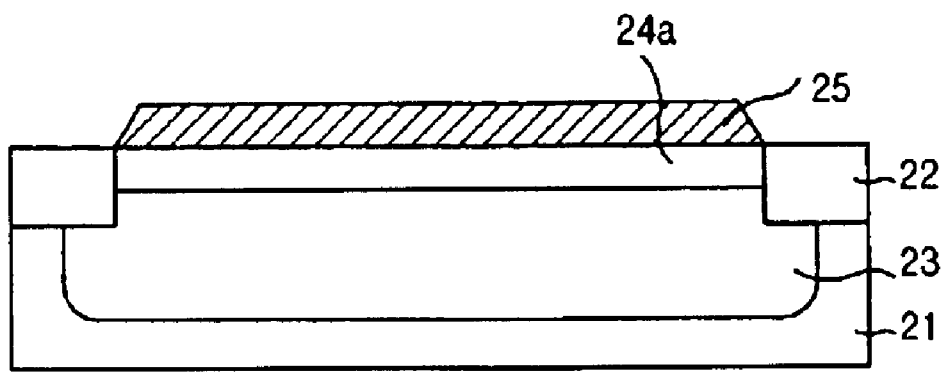
Figure 3A:
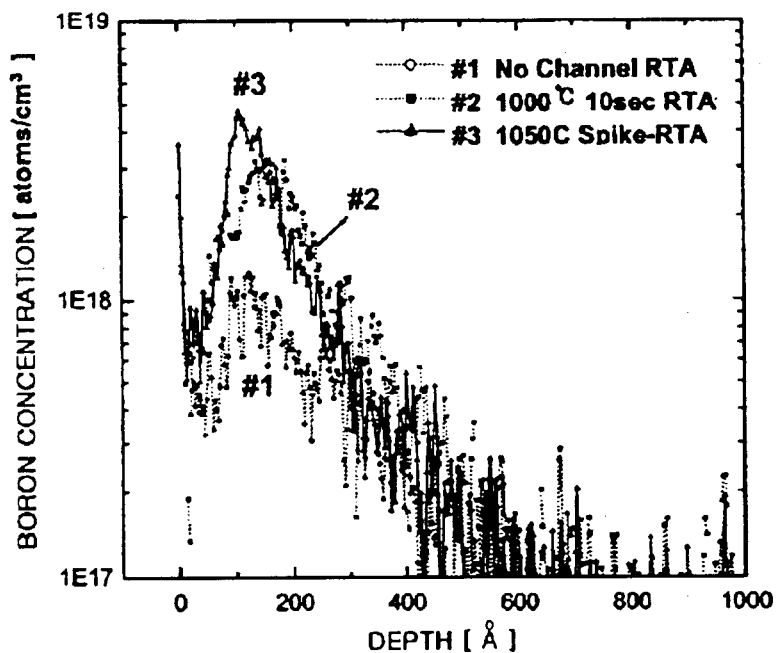
FIG. 3A is a graph showing doping profiles of SSR epi-channels formed by using selective epitaxial growth on 1 KeV boron ion implanted specimens.
Figure 3B:
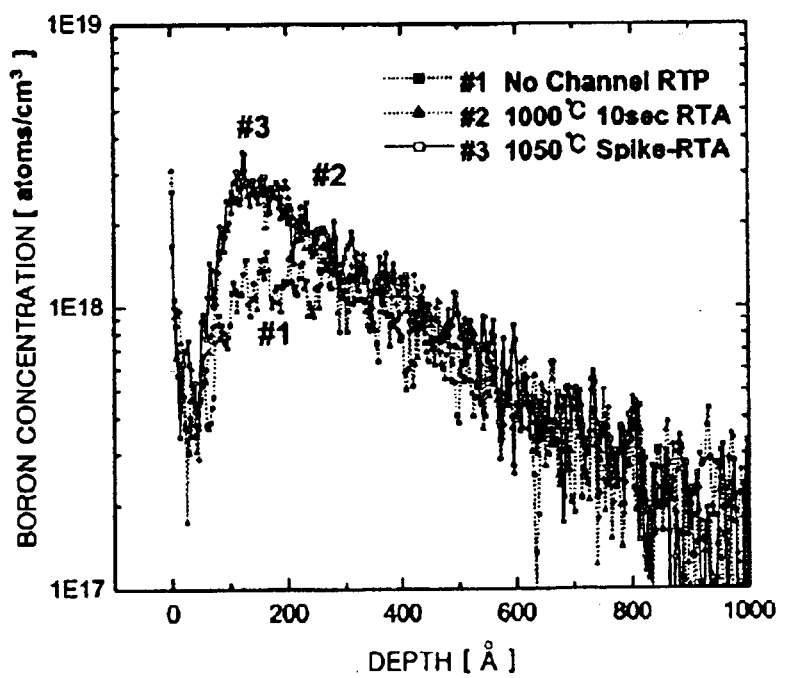
FIG. 3B is a graph showing a doping profile of SSR epi-channel formed by using selective epitaxial growth on 5 KeV boron ion implanted specimens.
Figure 4:
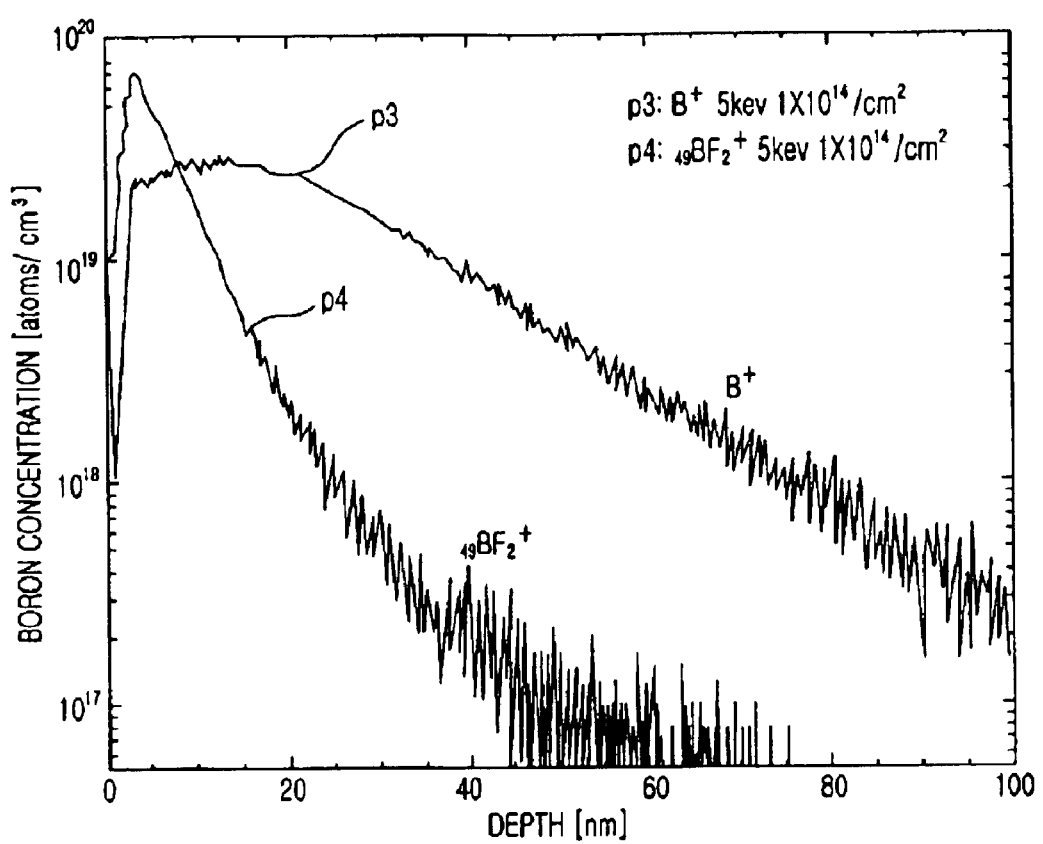
FIG. 4 is a graph showing the distributions of boron concentration when $B^+$ ions or $_{49}BF_2^+$ ions are implanted into a silicon substrate, respectively.

FIG. 4 is a graph showing a boron concentration distribution of a semiconductor substrate when $B^+$ ions or $_{49}BF_2^+$ ions are implanted into the silicon substrate.

In FIG. 4, a horizontal axis represents the depth within the substrate, and a vertical axis represents the boron concentration. Curves P3 or P4 represent the cases of $B^+$ or $_{49}BF_2^+$, respectively. Here, the boron ion implantation is out at an acceleration energy of 5 keV and at a doze of $1 \times 10^{14}$ atoms/cm$^3$, and the $BF_2^+$ ion implantation is carried out at an acceleration energy of 5 keV and at a doze of $1 \times 10^{14}$ atoms/cm$^3$.

Referring to FIG. 4, in the boron ion implantation, the boron ions are implanted deep into the substrate, and a peak value of profile is disposed at a deeper position than 10 nm. In case of $_{49}BF_2^+$, a peak value of profile is disposed at about 3 nm and the boron concentration decreases rapidly at deeper position.

The curves P3 and P4 show different decrease profiles from each other. The curve P4 has a narrower distribution of boron. Comparing the curve P3 with the curve P4, the peak value of the curve P4 is higher than that of the curve P3. This means that the $_{49}BF_2^+$ ion implantation can obtain the same or higher peak concentration using a smaller ion implantation amount than the ion doze of boron ($B^+$).

FIGS. 5A to 5F are cross-sectional diagrams illustrating a method for fabricating an NMOSFET in accordance with a first embodiment of the present invention.

Figure 5A:
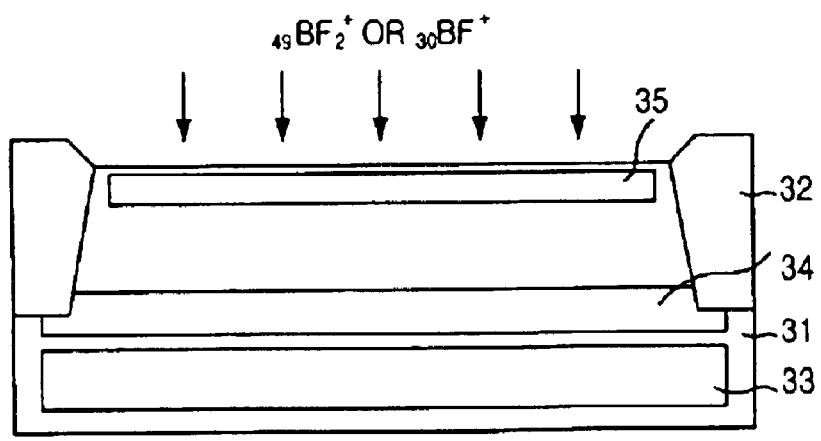
FIGS. 5A to 5F are cross-sectional diagrams illustrating a method for fabricating an NMOSFET in accordance with a first embodiment of the present invention.

As shown in FIG. 5A, the field oxide layer 32 for device isolation is formed on the predetermined portion of a semiconductive substrate 31 using shallow trench isolation (STI) process or local oxidation of silicon (LOCOS) process. Then, P-type dopants are implanted into the semiconductor substrate 31 to form a deep P-type well 33. Sequentially, P-type dopants are implanted to thereby form a P-type field stop layer 34 that are shallower than the P-type well 33. Here, boron (B) is used as the P-type dopants for forming the P-type well 33 and the P-type field stop layer.

Next, as the P-type dopants, molecular ions of fluorine compounds such as $_{49}BF_2^+$ or $_{30}BF^+$ are implanted to thereby form a shallow P-type n-channel doping layer 35 whose depth is 10 nm to 50 nm from a surface of the semiconductor substrate 31.

At this time, $_{49}BF_2^+$ or $_{30}BF^+$ molecular ions extracted from the $BF_3$ gas are implanted when performing the ion implantation for forming the P-type n-channel doping layer 35. The implantation of $_{30}BF^+$ molecular ions has an effect similar to that of $_{49}BF_2^+$ molecular ions. In other words, it has an advantage that it can use the ion implantation energy as high as the boron ion implantation in order to have the same ion implantation depth. In addition, the implanted fluorine ions are reduced to half the $_{49}BF_2^+$ molecular ions at the same implantation amount as the $_{49}BF_2^+$ molecular ions.

Figure 5B:
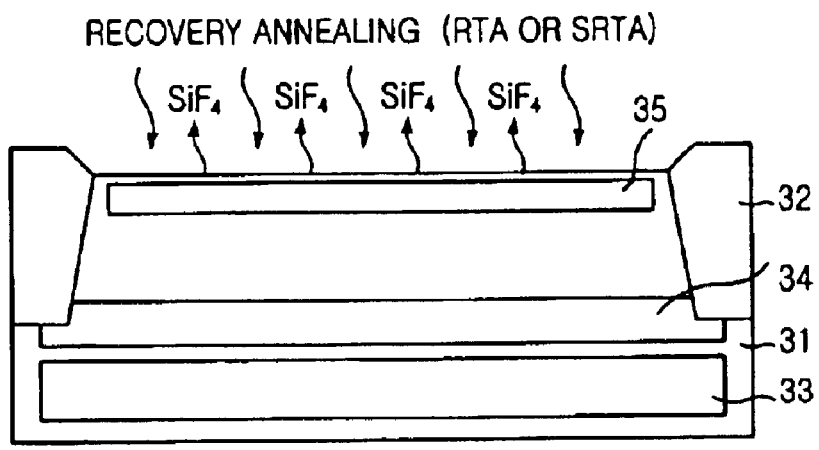

Then, as shown in FIG. 5B, a recovery annealing process is carried out. The recovery annealing process recovers a crystal defect in the surface of the semiconductor substrate 31, which is caused by an ion bombardment in the ion implantation for forming the P-type n-channel doping layer 35. Also, the recovery annealing process allows the dopants implanted into the P-type n-channel doping layer 35 to be stably combined with adjacent silicon atoms within the crystals and emits fluorine (F) ions as a volatile gas of $SiF_4$ to an exterior.

For the recovery annealing process, a rapid thermal annealing (RTA) process or a spike rapid thermal annealing (SRTA) process is carried out at a temperature of below 1414 (a melting point of silicon), which can recover the crystal defect, in order to prevent a diffusion of dopants implanted into the P-type n-channel doping layer 35.

Here, the spike rapid thermal annealing (SRTA) process represents an annealing process (ramping rate: 150 /sec or more, a delay time: 1 sec or less) which increases from a room temperature to a target temperature within a short time and then directly decreases from the target temperature to the room temperature without any delay.

Preferably, the rapid thermal annealing (RTA) process is carried out at a temperature of 600 to 1050 and the spike rapid thermal annealing (SRTA) process is carried out at a temperature of 600 to 1100.

As a result, through the recovery annealing process, the P-type n-channel doping layer 35 is improved as a layer with no crystal defect by stably combining the implanted dopants with the silicon ions of the semiconductor substrate 31. In other words, fluorine (F) ions are emitted during the annealing process and the boron (B) ions are stably combined with the silicon (Si) ions.

As described above, through the recovery annealing process, the P-type n-channel doping layer 35 is activated as a very shallow P-type n-channel doping layer 35A, which is chemically stable.

Figure 5C:
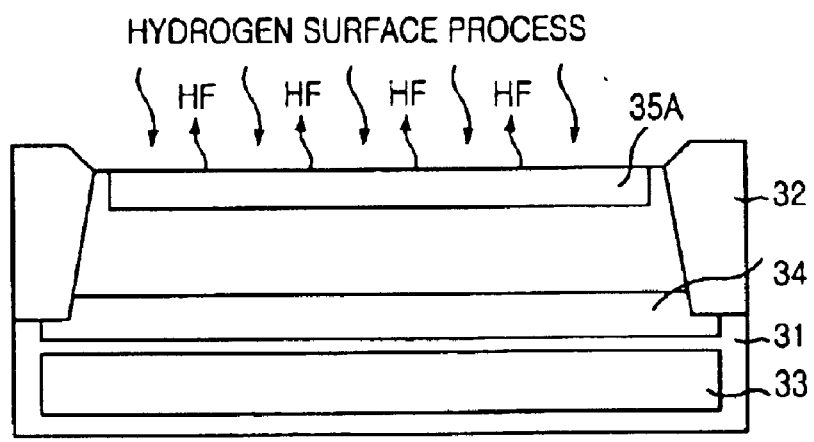

As shown in FIG. 5C, a surface process is carried out at a hydrogen atmosphere in order to remove a native oxide layer (not shown) formed on the shallow P-type n-channel doping layer 35A after the recovery annealing process. At this time, if the surface process is carried out at the hydrogen atmosphere, the hydrogen ($H_2$) is reacted with the native oxide layer ($SiO_2$) to be volatized as $H_2O$, so that the native oxide layer is removed. Also, it is desirable that a temperature in the surface process be a temperature (e.g., 600 to 950 which can prevent a diffusion of dopants existing within the P-type n-channel doping layer 35.

In the above-described surface process at the hydrogen atmosphere, fluorine (F) ions remained within the P-type n-channel doping layer 35A after the recovery annealing process are additionally emitted as a type of HF. Meanwhile, in case where $_{30}BF^+$ molecular ions are implanted into the P-type n-channel doping layer 35, implanted fluorine ions are reduced to half the $_{49}BF_2^+$ molecular ions at the same implantation amount as the $_{49}BF_2^+$ molecular ions, so that it is much easier to remove the fluorine ions.

As a result, it is much effective to remove the fluorine ions by implementing the $_{30}BF^+$ molecular ions having a relative smaller fluorine containing amount at a relatively larger implementing amount when forming the channel doping layer.

Figure 5D:
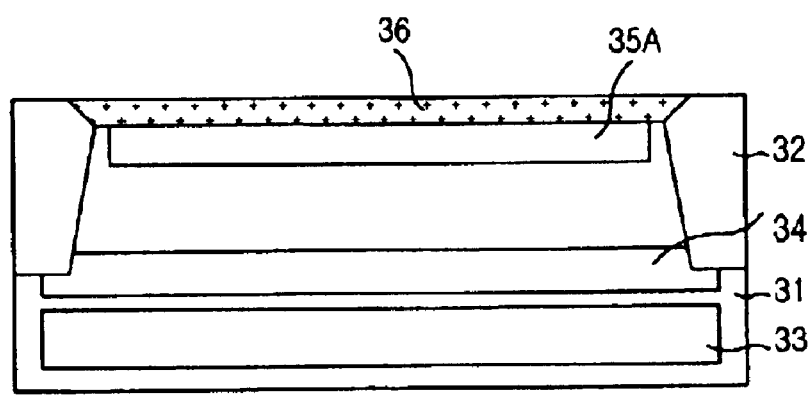

As shown in FIG. 5D, an epitaxial layer 36 is grown to a thickness of 5 nm to 30 nm on the semiconductor substrate 31 with no native oxide layer, preferably on the P-type n-channel doping layer 35, using a selectively epitaxial growth (SEG).

As described above, as the P-type n-channel doping layer 35 is activated to the very shallow P-type n-channel doping layer 35A that is chemically stabilized through the recovery annealing process, an SSR epi-channel structure with an SSR delta doping profile of which the loss and re-distribution of dopants is minimized is formed even during the surface process at the hydrogen atmosphere and the growth of the epitaxial layer 36.

Figure 5E:
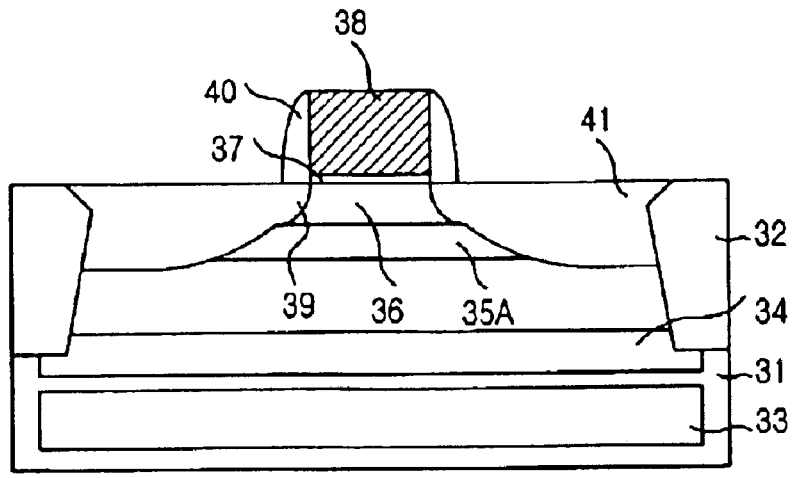

As shown in FIG. 5E, a gate dielectric layer 37 is formed at a temperature of 650 to 750 on the SSR epi-channel structure, e.g., the epitaxial layer 36 disposed at a lower portion of the P-type n-channel doping layer 35A. At this time, the temperature range for forming the gate dielectric layer 37 is relatively low so as to prevent a re-distribution and diffusion of dopants existing within the P-type n-channel doping layer 35A.

For this, a low temperature oxide (LTO) layer formed at a low temperature, a silicon oxynitride layer, a high dielectric layer or a stack layer of oxide layer/high dielectric layer is used as the gate dielectric layer 37. Because of the low thermal process for forming the gate dielectric layer 37 at a low temperature, the SSR doping profile can be maintained by preventing the re-distribution and the diffusion of dopants existing within the P-type n-channel doping layer 35A.

For example, the low temperature oxide layer (i.e., a silicon thermal oxide layer) is formed at a temperature of 650 to 750 After forming the silicon thermal oxide layer at a temperature of 650 to 750, the silicon oxynitride layer is formed by carrying out a nitride plasma or ammonia plasma to the silicon thermal oxide layer. The high dielectric layer is formed by carrying out a deposition process at a temperature of 300 to 650 and then a furnace annealing process at a temperature of 400 to 700, or by carrying out a deposition process at a temperature of 300 to 650 and then a rapid thermal annealing process at a temperature of 600 to 800. In case where the high dielectric layer is used, a maximum temperature is limited to 300 to 700 when an annealing process is carried out so as to improve a layer quality of the dielectric layer.

Next, a conductive layer for a gate dielectric layer is deposited on the gate dielectric layer 37 and patterned the deposited conductive layer to thereby form a gate electrode 38. Here, the conductive layer for forming the gate electrode 38 can be a polysilicon layer, a stack layer of polysilicon layer/metal layer, or a stack layer of polysilicon layer/silicide layer.

Then, using an additional photoresist mask (not shown) and the gate electrode 38 as an ion implantation mask, a large implantation amount of N-type dopants is implanted at a low energy to thereby form an N-type source/drain extension region 39. At this time, the N-type dopants used to form the N-type source/drain extension region 39 are phosphorus (P) or arsenic (As).

Sequentially, after depositing an insulating layer for spacers on an entire surface containing the gate electrode 38, the insulating layer for spacers is etched back to form spacers 40 contacted with sidewalls of the gate electrode 38. Here, the spacers use a nitride layer or an oxide layer.

Then, using the additional photoresist mask, the gate electrode 38 and the spacers 40 as an ion implantation mask, a large implantation amount of N-type dopants is implanted to form an N-type source/drain region 41 that is electrically connected to the N-type source/drain extension region 39. At this time, the N-type source/drain region 41 has a deeper ion implantation depth than the N-type source/drain extension region 39.

Figure 5F:
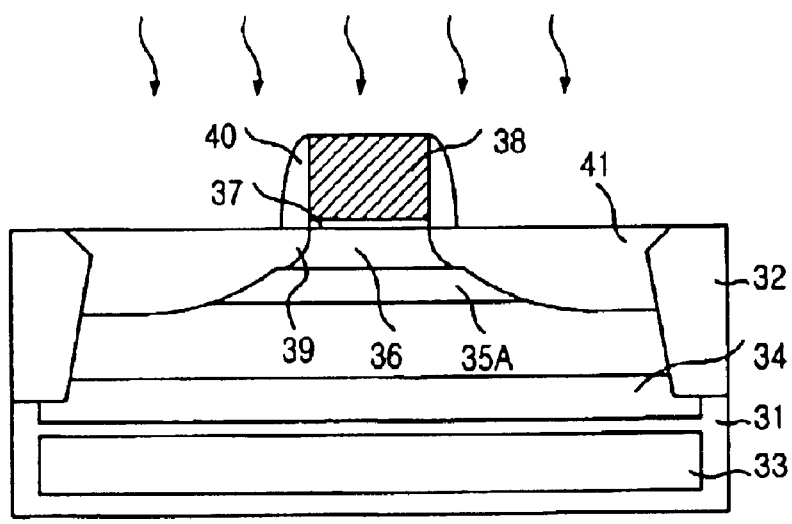

As shown in FIG. 5F, an activation annealing process is carried out so as to electrically activate the dopants existing within the N-type source/drain region 41 and the N-type source/drain extension region 39. At this time, the activation annealing process is carried out at a predetermined temperature which simultaneously inhibits the P-type n-channel doping layer 35A from being diffused and the junction depths of the N-type source/drain region 41 and the N-type source/drain extension region 39 from being deepened.

Preferably, the activation annealing process is selected from the group consisting of a rapid thermal annealing (RTA) process of 600 to 1000, a furnace annealing process of 300 to 750, a spike rapid thermal annealing (SRTA) process of 600 to 1100, and a combination thereof.

Meanwhile, if the process of forming the gate electrode 38 and the N-type source/drain region 41 is carried out through a low temperature process having a low thermal budget, the SSR epi-channel structure in which the diffusion of dopants is inhibited can be maintained.

In the above embodiment, the P-type n-channel doping layer 35A also acts as a punch stop layer for preventing a short channel effect. In addition, a junction capacitance and a junction leakage current with respect to an NP junction are reduced by forming a maximum doping depth of the P-type n-channel doping layer 35A shallower than that of the N-type source/drain region 41.

FIGS. 6A to 6F are cross-sectional diagrams illustrating a method for fabricating a CMOSFET in accordance with a second embodiment of the present invention.

Figure 6A:
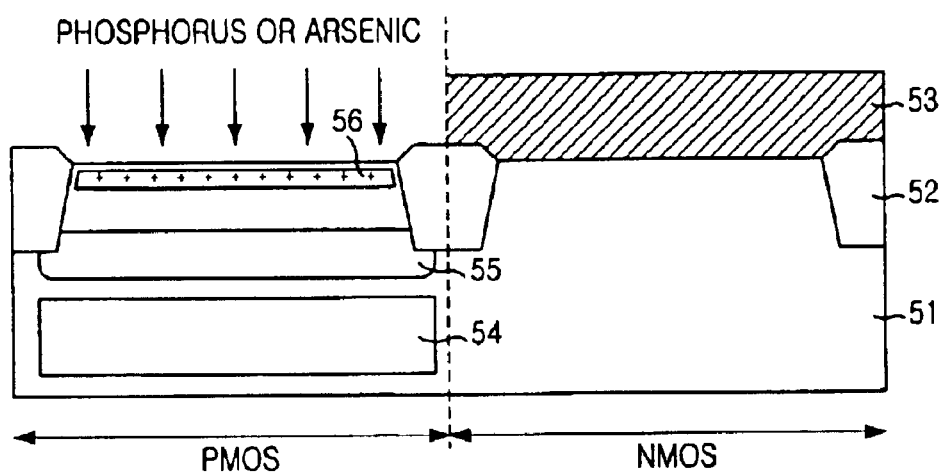
FIGS. 6A to 6F are cross-sectional diagrams illustrating a method for fabricating a CMOSFET in accordance with a second embodiment of the present invention.

As shown in FIG. 6A, a field oxide layer 52 for device isolation is formed on a predetermined portion of a semiconductor substrate 51 using a shallow trench isolation (STI) process or a local oxidation of silicon (LOCOS) process. Then, a photoresist is coated on the semiconductor substrate 51 and patterned using exposure and development processes to thereby form a first mask 53 for exposing a region (hereinafter, referred to as a "PMOS region") in which a PMOSFET is to be formed.

Then, N-type dopants such as phosphorus (P) are implanted into the semiconductor substrate 51 exposed by the first mask 53 to thereby form a deep N-type well 54. N-type dopants are sequentially implanted to form an N-type field stop layer 55 shallower than the N-type well 54.

Then, N-type dopants are implanted at an energy lower than an ion implantation energy for forming the N-type field stop layer 55 to there form a shallow N-type p-channel doping layer 56 of which a depth is 10 nm to 50 nm from a surface of the semiconductor substrate 51. At this time, phosphorus (P) or arsenic (As) is used as the N-type dopants.

Figure 6B:
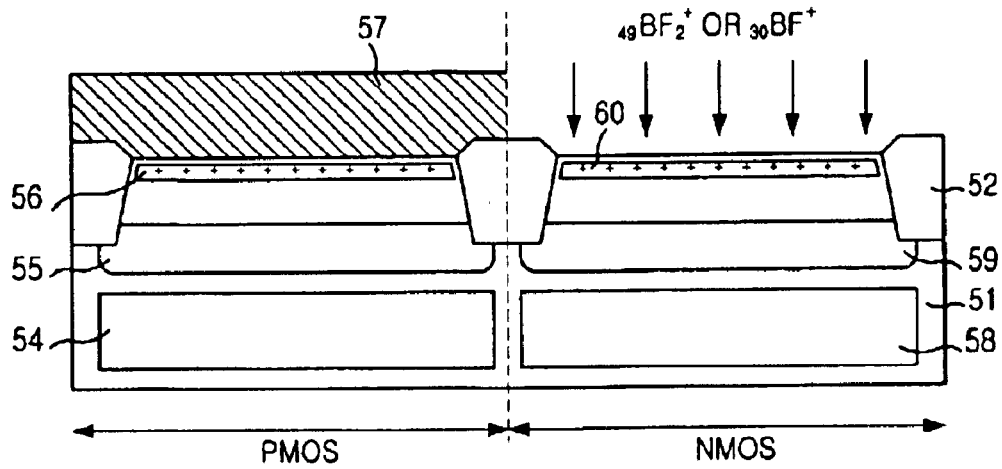

As shown in FIG. 6B, after removing the first mask 53, a photoresist is again coated on the semiconductor substrate 51 and patterned using exposure and development processes to thereby form a second mask 57 for exposing a region (hereinafter, referred to as a "NMOS region") in which a NMOSFET is to be formed.

Then, P-type dopants are implanted into the semiconductor substrate 51 exposed by the second mask 57 to thereby form a deep P-type well 58. P-type dopants are sequentially implanted to form a P-type field stop layer 59 shallower than the P-type well 54. At this time, boron (B) is used as the P-type dopants.

Next, molecular ions of fluorine compounds such as $_{49}BF_2^+$ or $_{30}BF^+$ are implanted to thereby form a shallow P-type n-channel doping layer 60 of which a depth is 10 nm to 50 nm from the surface of the semiconductor substrate 51.

Figure 6C:
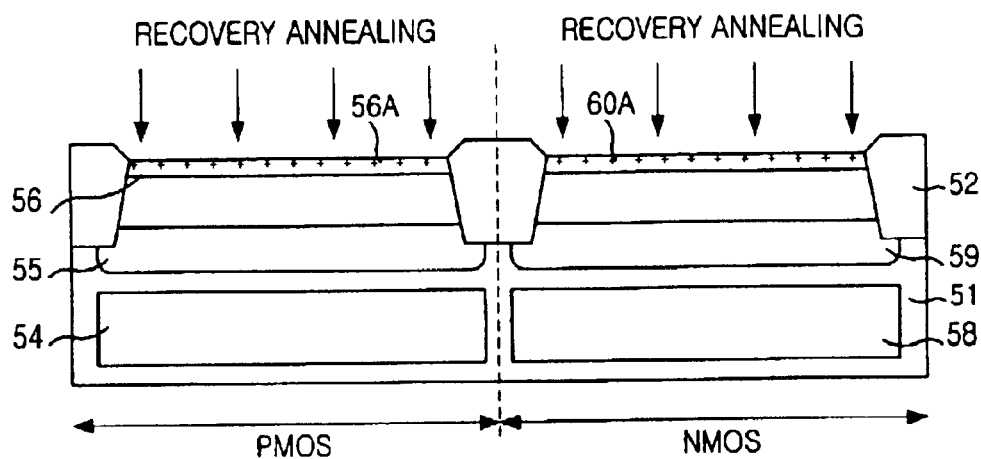

As shown in FIG. 6C, after removing the second mask 57, a recovery annealing process is carried out. The recovery annealing process recovers a crystal defect in the surface of the semiconductor substrate 51, which is caused by an ion bombardment in the ion implantation for forming the N-type p-channel doping layer 56 and the P-type n-channel doping layer 60. Also, the recovery annealing process allows the dopants implanted into the N-type p-channel doping layer 56 and the P-type n-channel doping layer 60 to be stably combined with adjacent silicon atoms within the crystals and also emits fluorine (F) ions implanted into the P-type n-channel doping layer 60 to an exterior.

For the recovery annealing process, a rapid thermal annealing (RTA) process or a spike rapid thermal annealing (SRTA) process is carried out at a temperature of below 1414 (a melting point of silicon), which can recover the crystal defect, in order to prevent a diffusion of dopants implanted into the N-type p-channel doping layer 56 and the P-type n-channel doping layer 60. Preferably, the rapid thermal annealing (RTA) process is carried out at a temperature of 600 to 1050 and the spike rapid thermal annealing (SRTA) process is carried out at a temperature of 600 to 1100.

As described above, through the recovery annealing process, the N-type p-channel doping layer 56 and the P-type n-channel doping layer 60 are improved as a layer with no crystal defect by stably combining the implanted dopants with the silicon ions of the semiconductor substrate 51. In particular, in the P-type n-channel doping layer 60, fluorine (F) ions are emitted during the annealing process and the boron (B) ions are stably combined with the silicon (Si) ions.

As a result, after the recovery annealing process, the N-type p-channel doping layer 56 and the P-type n-channel doping layer 35 are activated as a very shallow N-type p-channel doping layer 56A and a very shallow P-type n-channel doping layer 60A, which are chemically stable.

Figure 6D:
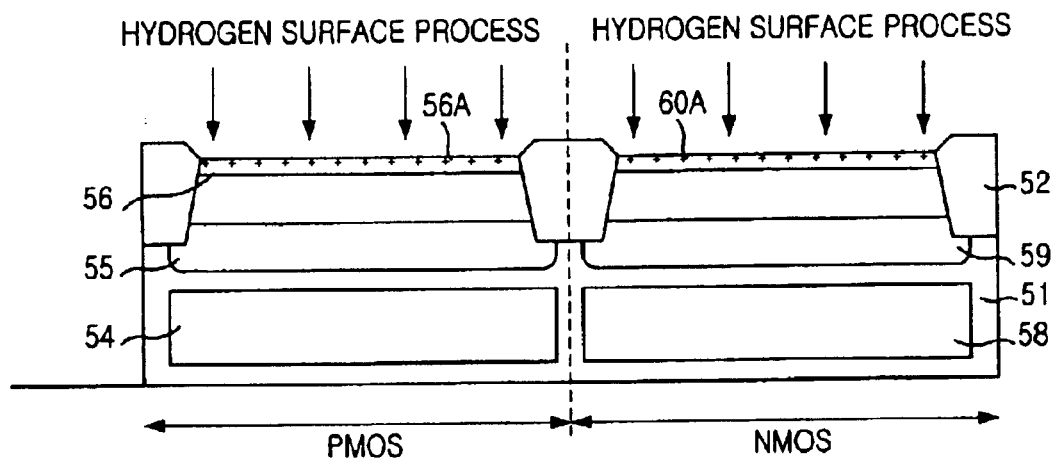

As shown in FIG. 6D, after the recovery annealing process, a surface process is carried out at a hydrogen atmosphere in order to remove a native oxide layer (not shown) formed on the N-type p-channel doping layer 56A and the P-type n-channel doping layer 60A, which have no crystal defect, during the recovery annealing process. At this time, if the surface process is carried out at the hydrogen atmosphere, the hydrogen ($H_2$) is reacted with the native oxide-layer ($SiO_2$) to be volatized as $H_2O$, so that the native oxide layer is removed. In addition, fluorine (F) ions remained within the P-type n-channel doping layer 60A even after the recovery annealing process are additionally emitted.

Figure 6E:
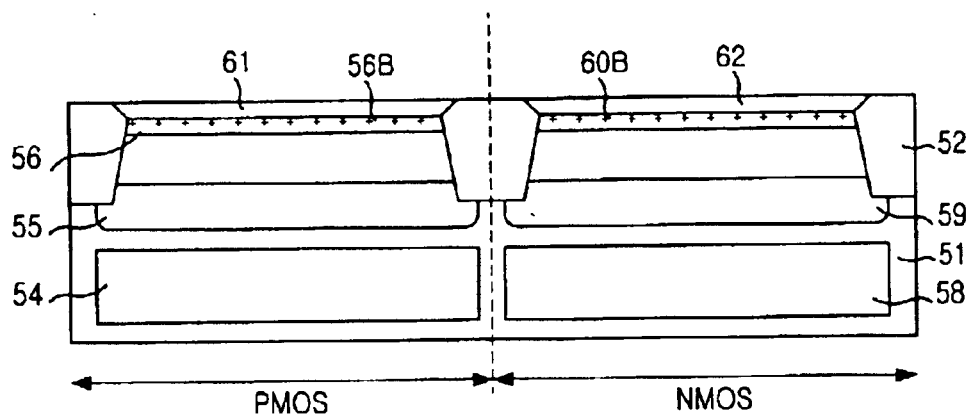

As shown in FIG. 6E, epitaxial layers 61 and 62 are simultaneously grown to a thickness of 5 nm to 30 nm on the N-type p-channel doping layer 56A and the P-type n-channel doping layer 60A, which have no native oxide layer, using a selectively epitaxial growth (SEG).

As described above, as the N-type p-channel doping layer 56 and the P-type n-channel doping layer 60 are activated to the very shallow N-type p-channel doping layer 56A and the very shallow P-type n-channel doping layer 60A chemically stabilized through the recovery annealing process, an SSR epi-channel structure with an SSR delta doping profile in which loss and re-distribution of dopants in the NMOS region and the PMOS region is minimized is formed even during the surface process at the hydrogen atmosphere and the growth of the epitaxial layers 61 and 62.

Figure 6F:
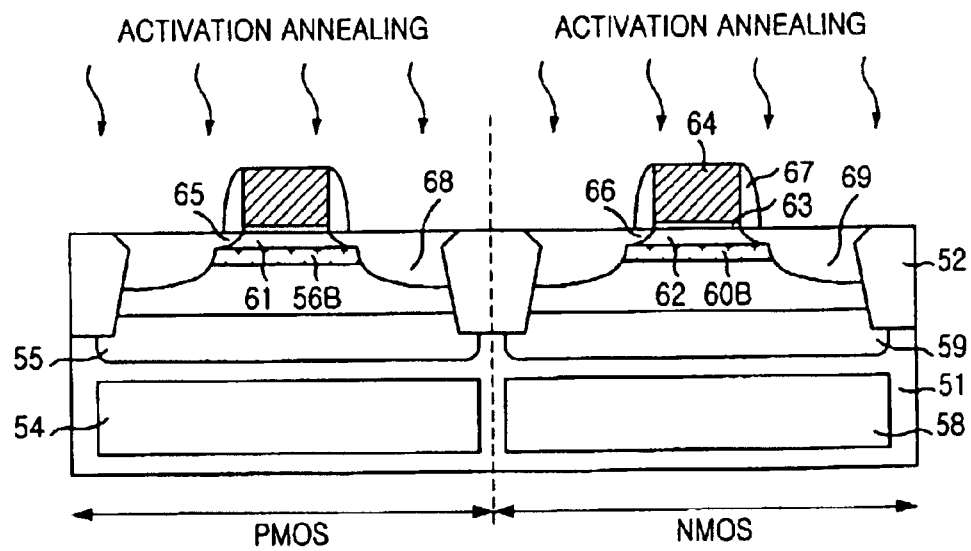

As shown in FIG. 6F, a gate dielectric layer 63 is formed at a temperature of 650 to 750 on the SSR epi-channel structure, e.g., the N-type p-channel doping layer 56A and the P-type n-channel doping layer 60A. At this time, the temperature range for forming the gate dielectric layer 63 is relatively low so as to inhibit a diffusion of dopants existing within the P-type n-channel doping layer 60A.

For this, a low temperature oxide (LTO) layer, a silicon oxynitride layer, a high dielectric layer or a stack layer of oxide layer/high dielectric layer is used as the gate dielectric layer 63. Because of the low thermal process of forming the gate dielectric layer 63 at a low temperature, the SSR doping profile can be maintained by preventing the re-distribution and the diffusion of dopants existing within the N-type p-channel doping layer 56A and the P-type n-channel doping layer 60A.

For example, the silicon thermal oxide layer is formed at a temperature of 650 to 750. After forming the silicon thermal oxide layer at a temperature of 650 to 750, the silicon oxynitride layer is formed by carrying out a nitride plasma or ammonia plasma to the silicon thermal oxide layer. The high dielectric layer is formed by carrying out a deposition process at a temperature of 300 to 650 and then a furnace annealing process at a temperature of 400 to 700, or by carrying out a deposition process at a temperature of 300 to 650 and then a rapid thermal annealing process at a temperature of 600 to 800. In case where the high dielectric layer is used, a maximum temperature is limited to 300 to 700 when an annealing process is carried out so as to improve a layer quality of the dielectric layer.

Next, a conductive layer for a gate dielectric layer is deposited on the gate dielectric layer 63 and patterned the deposited conductive layer to thereby form a gate electrode 64. Then, with respect to the PMOS region and the NMOS region, using additional photoresist mask (not shown) and the gate electrode 64 as respective ion implantation mask, a large implantation amount of P-type dopants is implanted into the PMOS region at a low energy to thereby form a P-type source/drain extension region 65. A large implantation amount of N-type dopant is implanted into the NMOS region at a low energy to thereby form an N-type source/drain extension-region 66.

Here, the conductive layer for forming the gate electrode 64 can be a polysilicon layer, a stack layer of polysilicon layer/metal layer, or a stack layer of polysilicon layer/silicide layer. In addition, the N-type dopants used to form the N-type source/drain extension region 66 are phosphorus (P) or arsenic (As), and the P-type dopants used to form the P-type source/drain extension region 65 are boron (B), $BF_2$, or boron compound ions containing boron.

Sequentially, after depositing an insulating layer for spacers on an entire surface containing the gate electrode 64, the insulating layer for spacers is etched back to form spacers 67 contacted with sidewalls of the gate electrode 64. Here, the spacers use a nitride layer, an oxide layer or a combination of nitride layer and an oxide layer.

Then, using the additional photoresist mask, the gate electrode 64 and the spacers 67 as an ion implantation mask, a large implantation amount of P-type dopants (boron or boron compound) is implanted into, the PMOS region to form a P-type source/drain region 68 that is electrically connected to the P-type source/drain extension region 65.

In addition, using the additional photoresist mask, the gate electrode 64 and the spacers 67 as an ion implantation mask, a large implantation amount of N-type dopants (phosphorus or arsenic) is implanted into the NMOS region to form an N-type source/drain region 69 that is electrically connected to the P-type source/drain extension region 66.

At this time, the N-type source/drain region 69 and the P-type source/drain region 68 have ion implantation depths deeper than the N-type source/drain extension region 66 and the P-type source/drain extension region 65, respectively.

Then, an activation annealing process is carried out so as to electrically activate the dopants implanted into the N-type source/drain region 69, the N-type source/drain extension region 66, the P-type source/drain region 68 and the P-type source/drain extension region 65.

At this time, the activation annealing process is carried out at a predetermined temperature which simultaneously inhibits the P-type source/drain region 68 and the P-type source/drain extension region 65 from being deepened.

That reason is because that the P-type source/drain region 68 and the P-type source/drain extension region-65 have severer diffusion change than the N-type source/drain region 69 and the N-type source/drain extension-region 66.

Preferably, the activation annealing process is selected from the group consisting of a rapid thermal annealing (RTA) process of 600 to 1000, a furnace annealing process of 300 to 750, a spike rapid thermal annealing (SRTA) process of 600 to 1100, and a combination thereof.

Meanwhile, if the processes of forming the gate electrode 64, the P-type source/drain extension region 65, the N-type source/drain extension region 66, the P-type source/drain region 68 and the P-type source/drain region 69 are carried out through a low temperature process having a low thermal budget, the SSR epi-channel structure in which the diffusion of dopants is inhibited can be maintained.

In the above-described second embodiment, the N-type p-channel doping layer 56A and the P-type n-channel doping layer 60A also act as a punch stop layer for preventing a short channel effect. In addition, a junction capacitance and a junction leakage current with respect to a PN junction and an NP junction are reduced by forming respective maximum doping depths of the N-type p-channel doping layer 56B and the P-type n-channel doping layer 60A shallower than those of the P-type source/drain region 68 and the N-type source/drain region 69.

Figure 7:
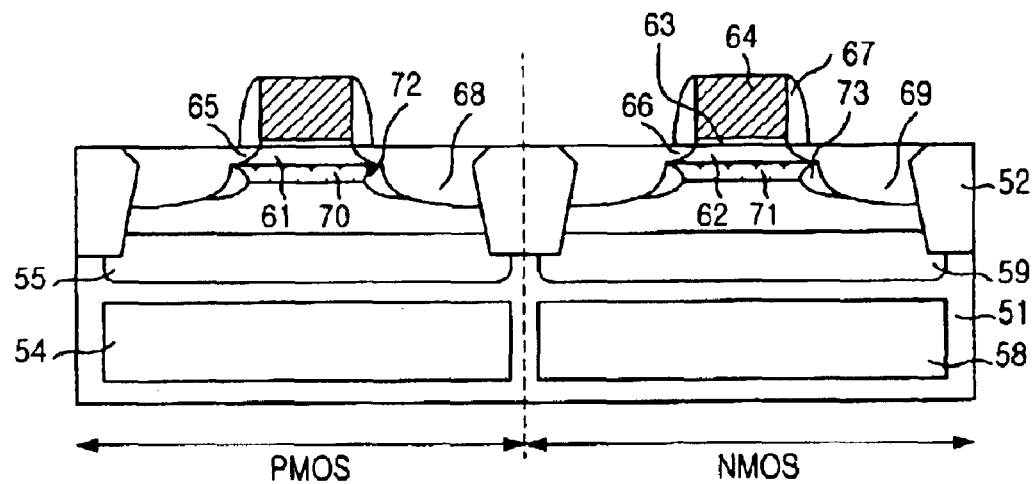
FIG. 7 is a cross-sectional diagram of a CMOSFET in accordance with a third embodiment of the present invention.

FIG. 7 is a cross-sectional diagram of a CMOSFET in accordance with a third embodiment of the present invention. The CMOSFET of FIG. 7 has the same structure as the second embodiment except for a first N-type punch stop layer 70, a second N-type punch stop layer 72, a first P-type punch stop layer 71 and a second P-type punch stop layer 73. Hereinafter, the same reference numerals as FIG. 6F are used in FIG. 7, and a detailed description about the same parts will be omitted.

In the same manner as the second embodiment, an epi-channel structure is formed on a PMOS region. The epi-channel includes a first N-type punch stop layer 70 formed by implanting phosphorus or arsenic ions and an-epitaxial layer 61 grown on the first N-type punch stop layer 70. Meanwhile, an epi-channel structure is formed on an NMOS region. The epi-channel includes a first P-type punch stop layer 71 formed by implanting fluorine compound ions and an epitaxial layer 62 grown on the first P-type punch stop layer 71.

Then, a second N-type punch stop layer 72 and a second P-type punch stop layer 73 are formed on lower portions of a P-type source/drain extension region 65 and an N-type source/drain extension region 66, respectively. At this time, the second N-type punch stop layer 72 is formed by implanting N-type dopants (phosphorus or arsenic) equal to the first N-type punch stop layer 70. Meanwhile, unlike the first P-type punch stop layer 71 formed by implanting boron-fluorine compound, the second P-type punch stop layer 73 is formed by implanting boron or boron compound.

Here, in order to respectively form the second N-type punch stop layer 72 and the second P-type punch stop layer 73 on the lower portions of the P-type source/drain extension region 65 and the N-type source/drain extension region 66, an ion implantation process is carried out before forming the P-type source/drain region 68 and the N-type source/drain region 69.

The first P-type punch stop layer 71 and the first N-type punch stop layer 70 act as a channel doping layer as well as a punch stop layer for preventing a short channel effect.

As a result, the CMOSFET in accordance with the third embodiment of the present invention has a dual punch stop layer structure. Compared with a single punch stop layer structure, the dual punch stop layer structure has an improved punch-through characteristic.

Figure 8:
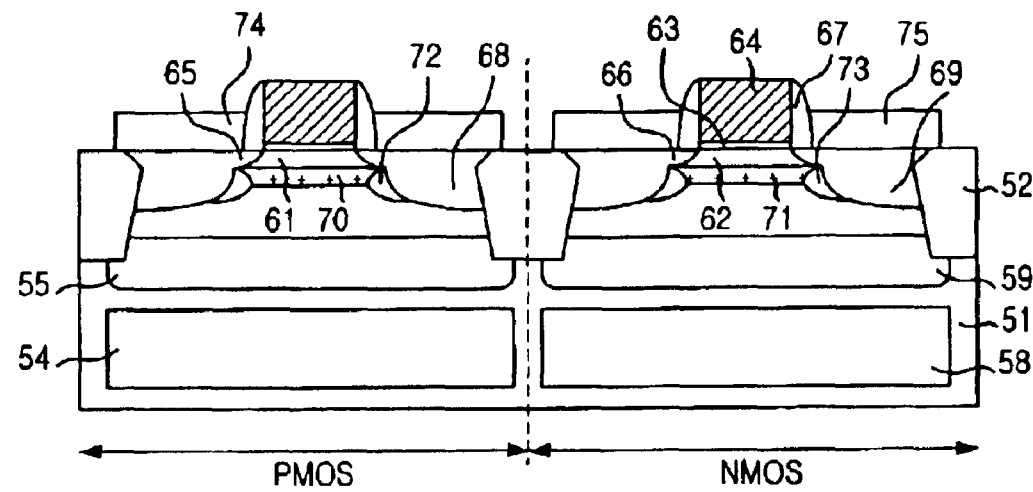
FIG. 8 is a cross-sectional diagram of a CMOSFET in accordance with a fourth embodiment of the present invention.

FIG. 8 is a cross-sectional diagram of a CMOSFET in accordance with a fourth embodiment of the present invention. The CMOSFET of FIG. 8 has the same structure as the third embodiment except for an elevated source/drain region. Hereinafter, the same reference numerals as FIG. 6F are used in FIG. 8, and a detailed description about the same parts will be omitted.

Referring to FIG. 8, in the same manner as the third embodiment, the CMOSFET in accordance with the fourth embodiment has a dual punch stop layer structure including a first N-type punch stop layer 70 and a second N-type punch stop layer 72 on a PMOS region, and a dual punch stop layer structure including a first P-type punch stop layer 71 and a second P-type punch stop layer 73 on an NMOS region. In addition, epitaxial layers are grown on the P-type source/drain region 68 and the N-type source/drain region 69, respectively, to thereby form elevated source/drain regions 74 and 75.

In the fourth embodiment of FIG. 8, a punch-through characteristic is improved by providing the dual punch stop layer through an ion implantation of boron-fluorine compound, and an increase in junction resistance of the source/drain is prevented by providing the elevated source/drain structure.

Figure 9:
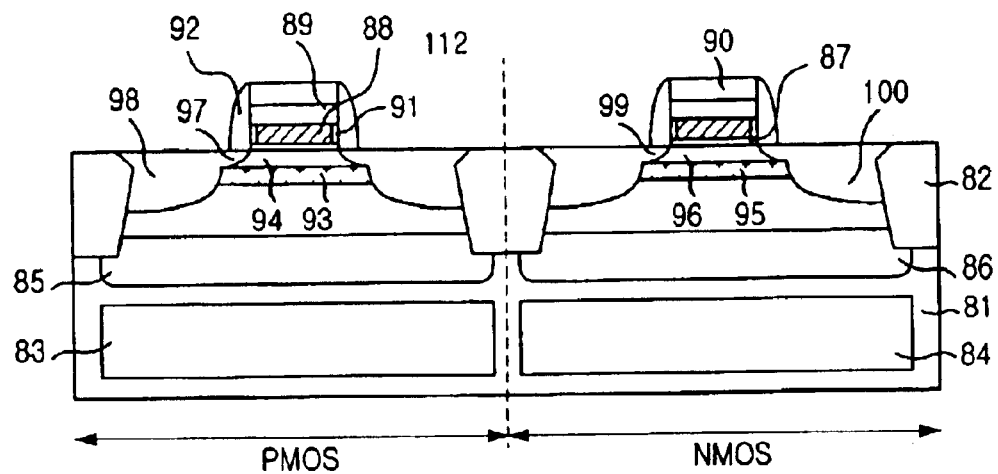
FIG. 9 is a cross-sectional diagram of a CMOSFET in accordance with a fifth embodiment of the present invention.

FIG. 9 is a cross-sectional diagram of a CMOSFET in accordance with a fifth embodiment of the present invention.

Referring to FIG. 9, an N-type well 83 and a P-type well 84 are formed within a semiconductor substrate 81 having a PMOS region and an NMOS region defined by a field oxide layer 82, respectively. An N-type field stop layer, 85 is formed at a shallower portion than the N-type well 83, and a P-type field stop layer 86 is formed at a shallower portion than the P-type well 84.

A gate dielectric layer 87, a polysilicon layer 88, a metal layer 89 and a hard mask 90 are sequentially formed on the PMOS and NMOS regions of the semiconductor substrate 81 regions to thereby form a stack gate structure. Then, sidewall oxide layers 91 are formed on both sidewalls of the polysilicon layer 88 constituting the gate structure, respectively. Spacers 92 are formed on both sidewalls of the gate structure.

An epi-channel having an N-type p-channel doping layer 93 and an epitaxial layer 94 is formed below the gate dielectric layer 87 of the PMOS region, and an epi-channel having an P-type n-channel doping layer 95 and an epitaxial layer 96 is formed below the gate dielectric layer 87 of the NMOS region.

P-type source/drain extension regions 97 are formed on both sides of the epi-channel of PMOS region, and P-type source/drain region 98 contacted with the P-type source/drain extension region 97 are formed deeper in a junction depth than the P-type source/drain extension region 97. N-type source/drain extension regions 99 are formed on both sides of the-epi-channel of NMOS region, and P-type source/drain region 100 contacted with the N-type source/drain extension region 99 are formed deeper in a junction depth than the N-type source/drain extension region 99.

In FIG. 9, the metal layer 89 formed on the polysilicon layer 88 is adopted for resistivity and high-speed operation of the gate electrode and generally utilizes tungsten and tungsten silicide. In addition, a diffusion barrier layer can be inserted between the polysilicon layer 88 and the metal layer 89.

The sidewall oxide layers 91 formed on both sidewalls of the polysilicon layer 88 is formed by oxidizing the polysilicon layer 88 using a gate re-oxidation process for recovering the gate dielectric layer 87 damaged during an etching process used to form the gate structure. As is well known, the gate re-oxidation process is carried out in order to improve reliability by recovering microtrench and loss of the gate dielectric layer 87 caused when etching the gate electrode, oxidizing an etching remaining material remained on a surface of the gate dielectric layer 87, and increasing a thickness of the gate dielectric layer 87 formed at an edge of the gate electrode.

The gate re-oxidation process is carried out in order to prevent a breakdown of the SSR doping profile, which is caused by a diffusion of dopants implanted into the P-type n-channel doping layer 95 due to an excessive thermal process. At this time, if the thermal oxidation process such as the re-oxidation process is carried out using a rapid thermal oxidation (RTO), its maximum temperature is limited to 750 to 950. Meanwhile, if the thermal oxidation process is carried out using a furnace annealing process, its maximum temperature is limited to 650 to 800.

As described above, if the gate re-oxidation process is carried out using a low temperature process with a low thermal budget, an SSR epi-channel structure in which the diffusion of dopants is inhibited can be maintained.

In the fifth embodiment of FIG. 9, the N-type p-channel doping layer 93 and the P-type n-channel doping layer 95 also act as a punch stop layer for preventing a short channel effect In addition, a junction capacitance and a junction leakage current with respect to a PN junction and an NP junction are reduced by forming respective maximum doping depths of the N-type p-channel doping layer 93 and the P-type n-channel doping layer 95 shallower than those of the P-type source/drain region 98 and the N-type source/drain region 100.

Figure 10:
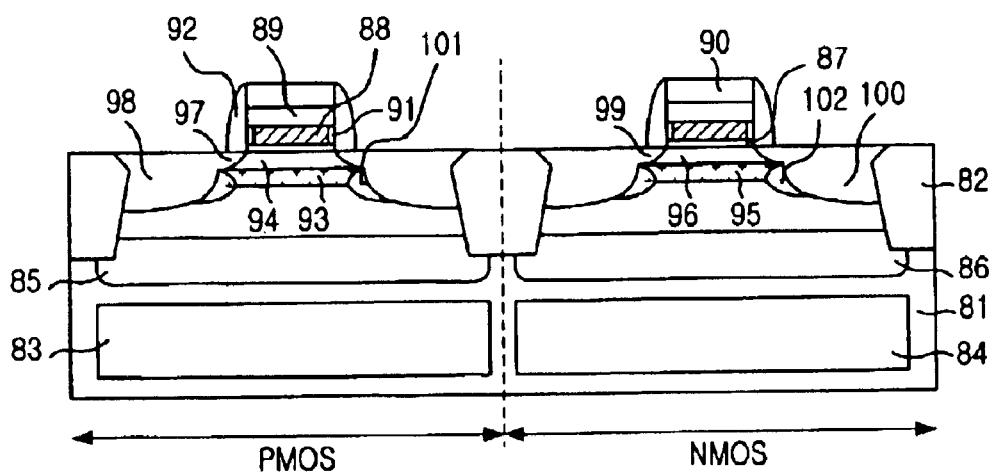
FIG. 10 is a cross-sectional diagram of a CMOSFET in accordance with a sixth embodiment of the present invention.

FIG. 10 is a cross-sectional diagram of a CMOSFET in accordance with a sixth embodiment of the present invention.

The CMOSFET of FIG. 10 has a dual punch stop layer structure including a first N-type punch stop layer 93 and a second N-type punch stop layer 101 on a PMOS region, a dual punch stop layer structure including a first P-type punch stop layer 95 and a second P-type punch stop layer 102 on an NMOS region. The other structure is the same as the CMOSFET of FIG. 9.

Figure 11:
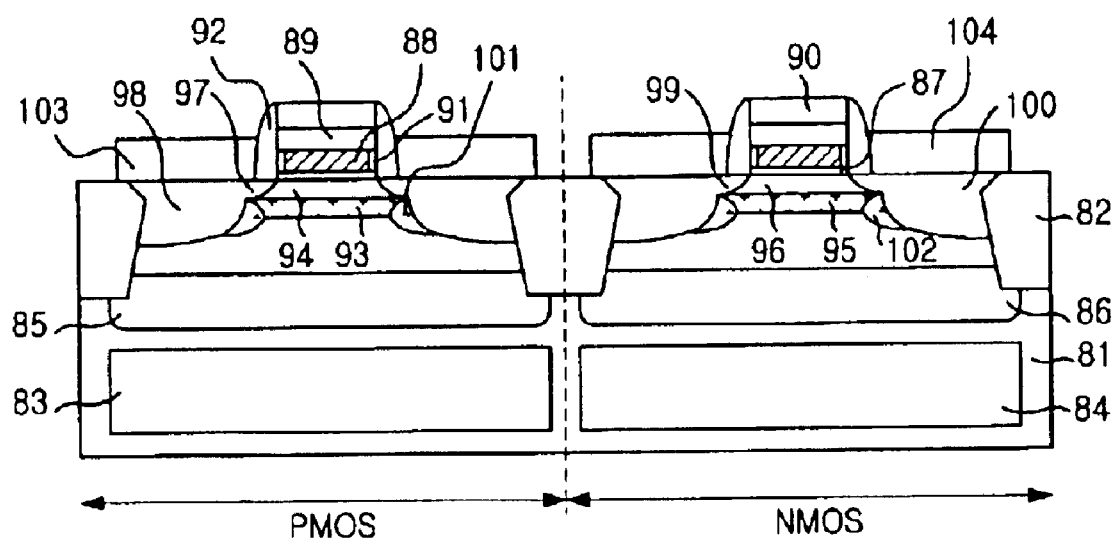
FIG. 11 is a cross-sectional diagram of a CMOSFET in accordance with a seventh embodiment of the present invention.

FIG. 11 is a cross-sectional diagram of a CMOSFET in accordance with a seventh embodiment of the present invention.

The CMOSFET of FIG. 11 has a dual punch stop layer structure including a first N-type punch stop layer 93 and a second N-type punch stop layer 101 on a PMOS region, a dual punch stop layer structure including a first P-type punch stop layer 95 and a second P-type punch stop layer 102 on an NMOS region. In addition, epitaxial layers are grown on the P-type source/drain region 98 and the N-type source/drain region 100, respectively, to thereby form elevated source/drain regions 101 and 104. The other structure is the same as the CMOSFETs of FIGS. 9 and 10.

In fabricating the NMOSFET and CMOSFET in accordance with the first to seventh embodiments of the present invention, in order to prevent the SSR doping profile from being broken down due to the diffusion of dopants within the channel, doping layer, which is caused by the excessive thermal processes during the following process performed after forming the SSR epi-channel structure, the maximum temperature in the following rapid annealing process is limited to 600 to 1000. In addition, the maximum temperature in the following spike rapid annealing process is limited to 600 to 1100 and the maximum temperature in the following furnace annealing process is limited to 300 to 750.

Meanwhile, although the semiconductor devices having the source/drain extension regions are described in the first to fifth embodiments of the present invention, the present invention is also applicable to a semiconductor device having a lightly doped drain (LDD) structure.

Figure 12:
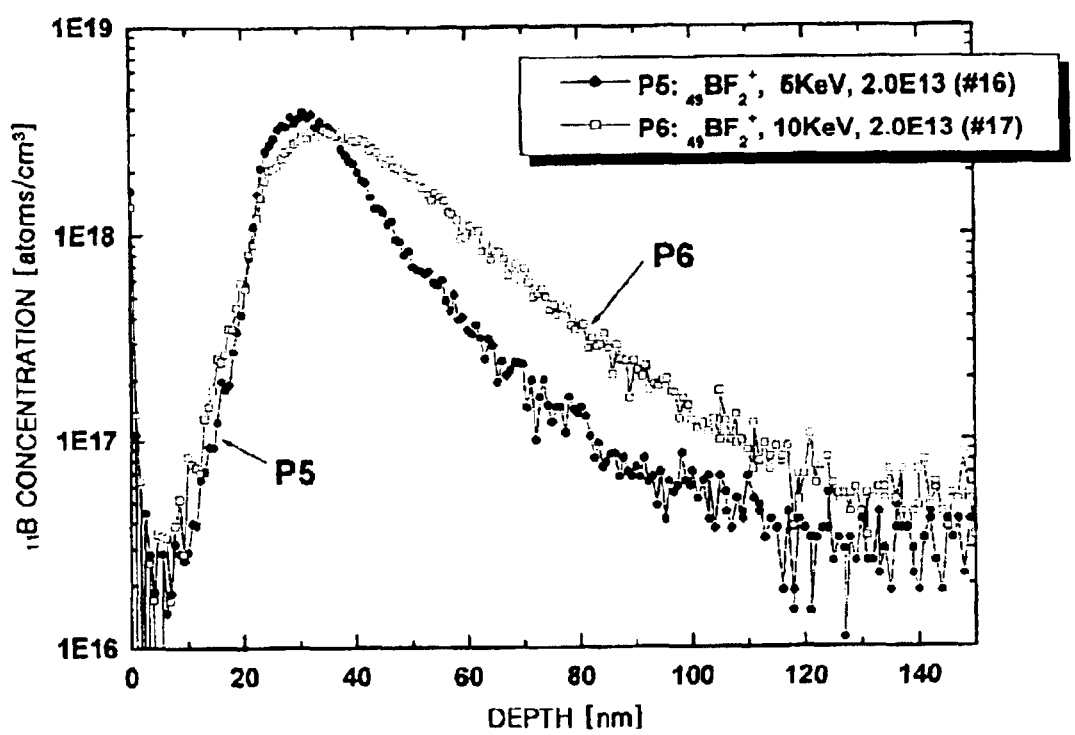
FIG. 12 is a graph illustrating the distributions of boron concentrations within an SSR epi-channel in which $_{49}BF_2^+$ ions are implanted into a channel region.

FIG. 12 is a graph illustrating a boron concentration distribution of the SSR epi-channel in which $_{49}BF_2^+$ ions are implanted into the channel region. FIG. 12 shows a result after completing all the thermal processes required to fabricate the semiconductor device, such as a gate oxidation and a spike thermal annealing process after forming the source/drain. A horizontal axis represents a depth within the substrate and a vertical axis represents a boron concentration. A curve PS is a result obtained by implanting $_{49}BF_2^+$ ions at a doze of $2\overline{7}10^{13}$ atoms/cm$^3$ and an acceleration energy of 5 keV, and a curve P6 is a result obtained by implanting $_{49}BF_2^+$ ions at a doze of $2\overline{7}10^{13}$ atoms/cm$^3$ and an acceleration energy of 10 keV.

Referring to FIG. 12, a peak value of the concentration is positioned at about 30 nm in the implantation of $_{49}BF_2^+$ ions, and the boron concentration is rapidly reduced at a deeper position.

The curves PS and P6 have different reduction profiles from each other. The curve PS has narrower boron diffusion and the peak value of the curve PS is higher than that of the curve P6.

Since the present invention can easily implement the ultra-shallow SSR channel structure with a narrow width of the delta doping profile, it is possible to implement a high speed device by reducing the junction capacitance of devices of sub 100 nm grade.

In addition, since productivity is improved compared with the SSR doping method using a low-energy boron ion implantation, a high performance device can be fabricated at a low cost. The present invention can prevent a variation of threshold voltage due to a random dopant induced (RDI) and a short channel effect of a sub 10 nm gate length at the same time, thereby improving the yield of the device.

The dopant concentration of the channel surface area can be reduced to 1/100 or more compared with the maximum concentration of the channel doping layer, thereby improving a surface mobility and a driving current characteristic.

Further, since the ultra-shallow SSR channel structure is easily implemented, it is easy to implement the low-voltage is device with a low threshold voltage and the low power consumption device.

While the present invention has been described with respect to certain preferred embodiments only, other modifications and variation may be made without departing from the spirit and scope of the present invention as set forth in the following claims.

What is claimed is:

1. A method for forming the epi-channel of a semiconductor device, the method comprising the steps of:
   a) forming a channel doping layer below the surface of a semiconductive substrate by implanting boron-fluoride compound ions containing boron;
   b) performing an annealing process to remove fluorine ions injected during above ion implantation within the channel doping layer;
   c) performing the surface treatment process to remove the native oxide layer formed on the surface of the channel doping layer and simultaneously to remove fluorine ions remained within the channel doping layer; and
   d) growing epitaxial layer on the channel doping layer using selective epitaxial growth method.

2. The method recited in claim 1, wherein the fluorine compound ions containing the boron include $_{49}BF_2^+$ or $_{30}BF^+$.

3. The method recited in claim 1, wherein the step b) is one a rapid thermal annealing process or a spike rapid thermal annealing process.

4. The method recited in claim 3, wherein the rapid thermal annealing process is carried out at a temperature of 600 to 1050, and the spike rapid thermal annealing process is carried out at a temperature of 600 to 1100.

5. The method recited in claim 1, wherein the step c) is carried out at an atmosphere containing hydrogen gas.

6. A method for fabricating a semiconductor device, the method comprising the steps of:
   a) forming a channel doping layer below the surface of a semiconductive substrate by implanting boron-fluoride compound ions containing boron;
   b) performing the first annealing process to remove fluorine ions, injected during above ion implantation, within the channel doping layer;
   c) performing the surface treatment process to remove the native oxide layer formed on the surface of the channel doping layer and simultaneously to remove remaining fluorine ions within the channel doping layer;
   d) growing an epitaxial layer on the channel doping layer;
   e) sequentially forming gate dielectric layer and gate electrode on the epitaxial layer;
   f) forming source/drain extension regions aligned at edges of the gate electrode, wherein the source/drain extension regions are shallower than the channel doping layer;
   g) forming spacers contacted with both sides of the gate electrode;
   h) forming source/drain regions aligned at edges of the spacers of the gate electrode, wherein the source/drain extension regions are deeper than the channel doping layer; and
   i) performing the second annealing process, for the activation of dopants contained in the source/drain extension regions and the source/drain regions, at a temperature suppressing the diffusion of the channel doping layer.

7. The method recited in claim 6, further comprising, after the step f), the step of forming a punch-stop doping layer below the source/drain extension region, wherein the punch-stop doping layer is connected with the channel doping layer.

8. The method recited in claim 7, wherein the punch-stop doping layer is formed by implanting boron ions.

9. The method recited in claim 6, wherein the step b) is one among the rapid thermal annealing process or the spike repaid thermal annealing process.

10. The method recited in claim 9, wherein the rapid thermal annealing process is carried out at a temperature of 600 to 1050, and the spike rapid thermal annealing process is carried out at a temperature of 600 to 1100.

11. The method recited in claim 6, wherein the boron-fluoride compound ions containing the boron include $_{49}BF_2^+$ or $_{30}BF^+$.

12. The method recited in claim 6, wherein the second annealing process is one selected form the group consisting of a rapid thermal annealing process of 600 to 1000, a furnace annealing process of 300 to 750, a spike rapid thermal annealing process of 600 to 1100 and a combination thereof.

13. The method as recited in claim 6, further comprising, after the step i), the step of selectively growing elevated source/drain regions on the source/drain regions.

14. The method as recited in claim 6, wherein the step e) further comprising the step of re-oxidizing the gate dielectric layer exposed after forming the gate electrode.

15. The method as recited in claim 14, wherein the step of re-oxidizing the gate dielectric layer is carried out using the rapid oxidization method whose maximum temperature is limited in the range of 750 to 950.

16. The method as recited in claim 14, wherein the step of re-oxidizing the gate dielectric layer is carried out through the thermal oxidization method using the furnace, whose maximum temperature is limited in the range of 750 to 950.

17. The method as recited in claim 6, wherein the step c) is carried out at the atmosphere containing hydrogen gas.

* * * * *